United States Patent
Miller et al.

(12) 
(10) Patent No.: US 6,268,807 B1
(45) Date of Patent: Jul. 31, 2001

(54) PRIORITY ENCODER/READ ONLY MEMORY (ROM) COMBINATION

(75) Inventors: Michael H. Miller, Los Gatos; Eric H. Voelkel, Ben Lomand, both of CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/495,764

(22) Filed: Feb. 1, 2000

(51) Int. Cl.[7] .................................................. H03M 7/00
(52) U.S. Cl. ........................................................... 341/50
(58) Field of Search ........................................ 341/50, 160

(56) References Cited

U.S. PATENT DOCUMENTS

| | | |
|---|---|---|
| 4,348,741 | 9/1982 | McAlister et al. . |
| 4,566,064 * | 1/1986 | Whitaker ................................ 326/38 |
| 4,831,573 * | 5/1989 | Norman ................................. 708/230 |
| 4,887,084 | 12/1989 | Yamaguchi . |
| 5,123,105 | 6/1992 | Wyland et al. . |
| 5,160,923 | 11/1992 | Sugawara et al. . |
| 5,230,054 * | 7/1993 | Tamura ................................. 710/244 |
| 5,265,258 | 11/1993 | Fiene et al. . |
| 5,355,013 * | 10/1994 | Parker .................................. 257/458 |
| 5,508,641 * | 4/1996 | Appenzeller et al. ............... 326/113 |
| 5,511,222 | 4/1996 | Shiba et al. . |
| 5,555,397 | 9/1996 | Sasama et al. . |
| 5,602,545 | 2/1997 | Ishii et al. . |

* cited by examiner

Primary Examiner—Howard L. Williams
(74) Attorney, Agent, or Firm—Bradley T. Sako

(57) ABSTRACT

According to one embodiment, a priority encoder (PE)/read-only-memory (ROM) combination circuit (200) includes detect circuits (206-xy) and passgate circuits (208-xy) arranged into rows (202-x) and columns (202-y). Detect circuits (206-xy) of the same column can be activated by a corresponding input signal (M0 to M7). When a detect circuit (206-xy) of a column (202-y) is activated, the passgates (208-xy) of the same column are disabled, preventing any lower priority active input signals (M0 to M7) from propagating further into the circuit.

20 Claims, 7 Drawing Sheets

PRIORITY ENCODER/READ ONLY MEMORY (ROM) COMBINATION

TECHNICAL FIELD

The present invention relates generally to encoder circuits, and more particularly to circuits that may be used in content addressable memories (CAMs) to prioritize and encode match indications.

BACKGROUND OF THE INVENTION

Priority encoder circuits typically receive a number of input signals that can have active and inactive levels. When multiple active input signals are received, a priority encoder can select one of the active input signals according to predetermined criteria. For example, input signals may have a particular order, and a priority encoder can always select the lowest active input signal in the particular order.

One particular application for priority selection circuits is in content addressable memories (CAMs). A CAM can include an array of CAM cells that compare stored values to an applied comparand value, and in the event there is a match, activate a match indication. A priority encoder circuit can then select among the multiple match indications to generate single prioritized match indication. In CAM applications, priority among multiple match indications can be established according to the physical location of the CAM cells. As just one example, priority can be given to the match indication corresponding to a lowest physical address for the CAM cell array.

In addition to a priority selection circuit, many CAMs will also include an address encoder. An address encoder receives a match signal having priority, and generates an address value from the match signal. The address value can be used to access data associated with a particular match signal. In some applications the address encoder is essentially a read only memory (ROM) that can provide addresses as output values. In this way, a CAM will receive a comparand value and generate match signals. The CAM will then determine priority from the match signals, and generate an address value. The address value may then be used to access associated data.

To better understand the structure and operation of priority encoder circuits and address encoder circuits, a conventional approach to prioritizing and encoding signals will be described.

Referring now to FIG. 7, a conventional priority encoder circuit is set forth in a schematic diagram. The conventional priority selection circuit is designated by the general reference character 700, and is shown to receive eight input signals BM_0 to BM_7, that are active when low, and provide eight output signals M_0 to M_7, that are active when high. In the particular arrangement of FIG. 7, priority is provided according to position, top to bottom in the view presented.

The conventional priority encoder 700 includes an inverter 702, seven two-input NOR gates 704-1 to 704-7, seven n-channel metal-oxide-semiconductor (NMOS) transistors, and a number of p-channel MOS (PMOS) transistors. The PMOS transistors can be conceptualized as being arranged into rows 706-0 to 706-7. Rows 706-0 to 706-7 can be conceptualized as being associated with input signals BM_0 to BM_7, respectively. Further, the inverter 702 can be conceptualized as being associated with input BM_0, while NOR gates 704-1 to 704-7 can be conceptualized as being associated with inputs BM_1 to BM_7, respectively.

In general, the circuit of FIG. 7 operates by first precharging all input signals (BM_0 to BM_7) to a high level. The n-channel MOS transistors, can turn on, driving one input of each NOR gate to a low level.

Subsequently, one or more of the input signals (M_0 to M_7) is driven low. The p-channel MOS transistors are arranged to force the outputs of those NOR gates associated with lower priority input signals to a high level. For example, in the event the BM_0 signal is low, the PMOS transistors of row 706-0 will turn on, resulting in a high input to NOR gates 704-1 to 704-7. Consequently, associated outputs M_1 to M_7 are inactive (driven low).

If it is assumed that the inverter 702 and NOR gates 704-1 to 704-7 are complementary MOS (CMOS) circuits, the total transistor count for the priority encoder of FIG. 7 is 65.

Referring now to FIG. 8, an address encoder is set forth in a schematic diagram. The address encoder is ROM, and is designated by the general reference character 800. The ROM 800 receives prioritized output signals M_0 to M_7 from a priority encoder, and encodes a single active signal (M_0 to M_7) into a three bit binary value X2, X1, X0.

The particular ROM 800 of FIG. 8 includes PMOS pull-up transistors 802-0 to 802-2 coupled to output lines 804-0 to 804-2. Provided signals M_0 to M_6 are inactive (low), pull-up transistors (802-0 to 802-2) maintain the output lines (804-0 to 804-2) high. However, when one of the signals M_0 to M_6 is active, one or more of the output lines (804-0 to 804-2) is driven low by a pull-down NMOS transistors (806-00 to 806-23) to generate a corresponding binary output value (X2–X0).

It is noted that the total transistor count for the ROM 800 of FIG. 8 is fifteen. Further, because the NMOS transistors (806-00 to 806-23) must "overpower" the PMOS pull-up transistors (802-0 to 802-2), each NMOS transistor can be a relatively large device. As a result, a priority encoder/ROM combination of FIGS. 7 and 8 includes eighty transistors total, including ROM NMOS transistors of relatively large size.

A concern with nearly all integrated circuits is the overall size of the device. Smaller integrated circuit (IC) sizes can translate into reduced manufacturing costs. Smaller IC sizes can also be desirable as they can present smaller "footprints" on a circuit board and thus contribute to smaller overall electronic device size. Further, reducing one circuit section of an IC can allow more room for other circuit sections.

In light of the desirability of smaller circuit sizes, it would be desirable to arrive at some way of providing priority encoder and address encoding functions with a smaller circuit than the conventional approach.

SUMMARY OF THE INVENTION

According to the disclosed embodiments, a circuit is provided that can prioritize input signals and encode the signal having the highest priority. The encoded value can be provided on a number of output lines. Particular output lines can be driven by detect circuits when a particular input signal is activated. When more than one input signal is active, those input signals having a lower priority are prevented from propagating to, and activating, corresponding detect circuits.

According to one aspect of the embodiments, the circuit can include detect circuits and passgate circuits arranged into columns, each column corresponding to a particular output line. When a detect circuit of a column is activated, the passgate circuits of the same column are disabled, preventing lower priority input signals from further propagating to lower priority detect circuits.

According to another aspect of the embodiments, each detect circuit includes one transistor and each passgate circuit has two transistors, resulting in a compact circuit.

DETAILED DESCRIPTION OF THE EMBODIMENTS

Various embodiments will now be described in conjunction with a number of schematic diagrams as well as a timing diagram. The embodiments set forth an approach to forming a circuit that provides the combined functions of a priority encoder and address encoder in a single compact circuit arrangement.

Figure 1:
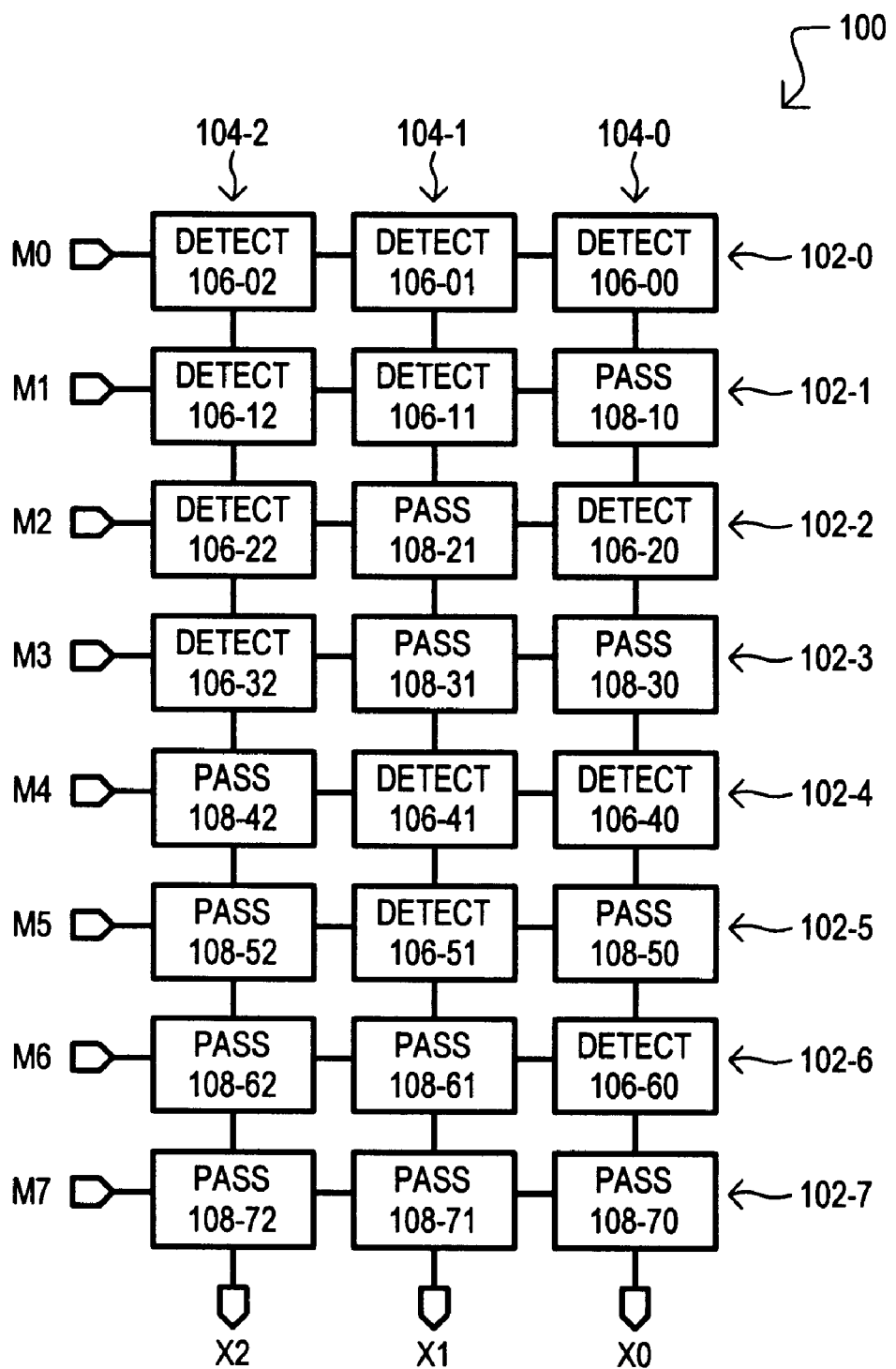
FIG. 1 is a block schematic diagram of a first embodiment.

Referring now to FIG. 1, a block schematic diagram is set forth illustrating one embodiment of the present invention. The first embodiment is designated by the general reference character 100 and will be referred to herein as a priority encoder (PE)/read-only-memory (ROM) circuit.

The first embodiment 100 can receive a number of input signals shown as M0 to M7. The input signals (M0 to M7) can be prioritized, and the one signal having the highest priority can be encoded into an output value, shown as X2–X0. The PE/ROM circuit 100 can be conceptualized as including detect circuits and passgate circuits arranged into rows 102-0 to 102-7 and columns 104-0 to 104-2. Rows 102-0 to 102-7 are associated with input signals M0 to M7, respectively. Columns 104-0 to 104-2 are associated with output values X0 to X2, respectively. Detect circuits are indicated by the reference characters 106-xy and passgate circuits are indicated by the reference characters 108-xy, where x is a particular row and y is a particular Column.

A detect circuit 106-xy can detect when the input signal of its corresponding row (102-0 to 102-7) is active, and in response, drive the output value of its corresponding column to a predetermined logic level. As but one example, if input signal M0 is active high, detect circuit 106-02 can drive output value X2 low.

A passgate circuit 108-xy can be enabled and disabled. When enabled, a passgate circuit 108-xy can allow an active input signal (M0 to M7) to propagate from one column to a subsequent column. When disabled, a passgate circuit 108-xy can prevent an active input signal (M0 to M7) from propagating to a subsequent column. As but one example, when passgate circuit 108-42 is enabled, if input signal M4 is active, the signal can propagate through passgate circuit 108-42 to detect circuits 106-41 and 106-40. Detect circuits 106-41 and 106-40 can then drive output values X1 and X0 low. In contrast, when passgate circuit 108-42 is disabled, if input signal M4 is active, it is prevented from propagating through to detect circuits 106-41 and 106-40.

In the first embodiment 100, priority is established by disabling passgate circuits 108-xy of a particular column when a detect circuit 106-xy of the column senses an active input signal. As but one example, if detect circuit 106-32 determines that input signal M3 is active, passgate circuits 108-42, 52, -62, and -72 will be disabled. As another example, if detect circuit 106-40 determines that signal M4 is active, passgate circuits 108-10, -30, -50 and -70 will be disabled.

It is understood the FIG. 1 represents a generalized case that may be used in a repeatable fashion for the prioritizing and encoding of more than eight input signals. As will be described below, columns (104-0 to 104-2) can have fewer circuit components.

In this way, a first embodiment 100 can utilize an arrangement of detect circuits 106-xy and passgate circuits 108-xy to both prioritize and encode input signals (M0 to M7) into output values X0 to X2.

An alternate way of conceptualizing the first embodiment 100 is to consider the columns (104-2 to 104-0) as having decreasing significance. That is, column 104-2 would have the most significance while column 104-0 would have the least significance. When particular input signals are activated (104-2 to 104-0), the detect circuits 106-xy of the column can be activated, while passgate circuits 108-xy of the column are disabled, thereby preventing any lower priority input signals from propagating to the circuits of a column having less significance.

Figure 2:
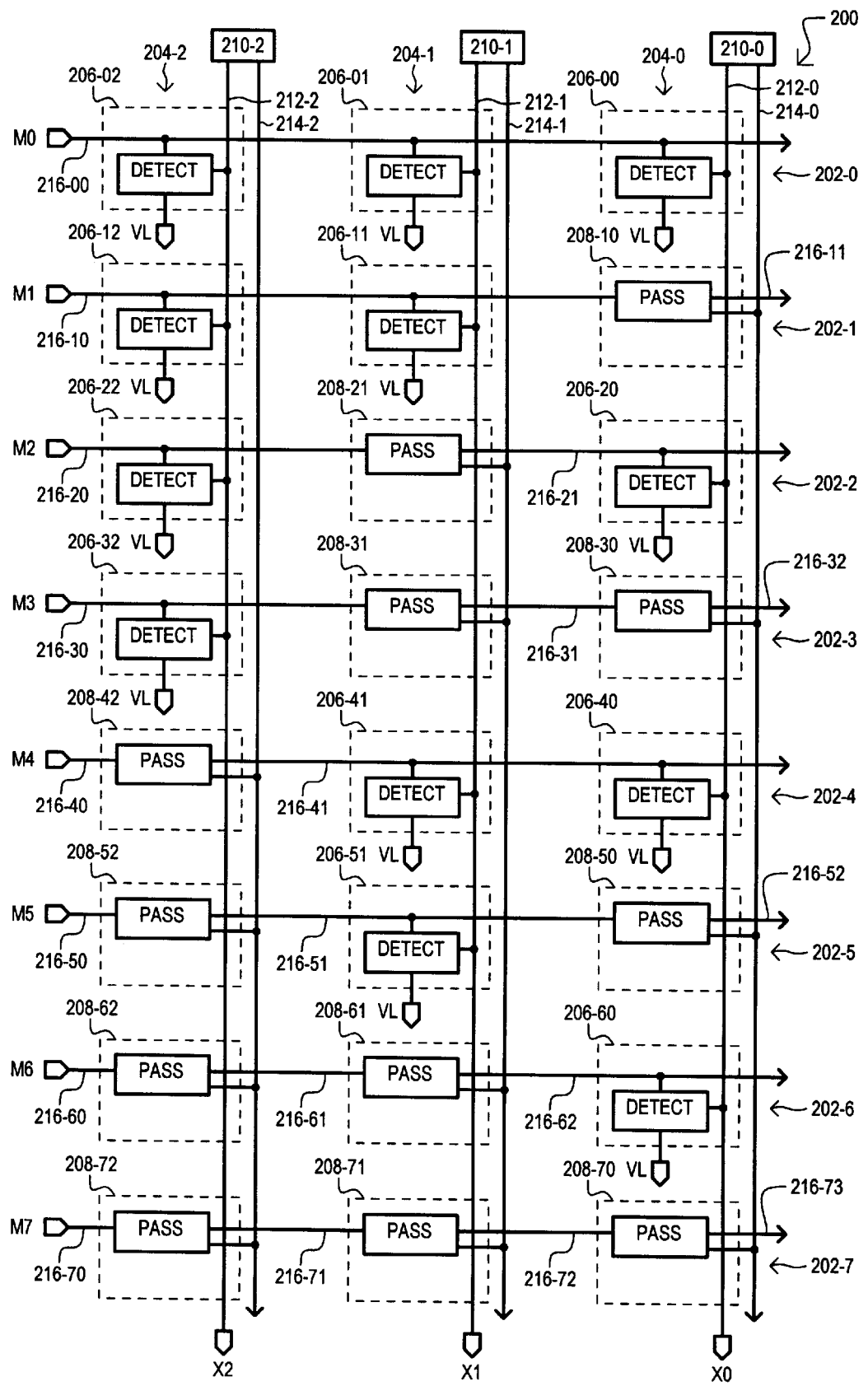
FIG. 2 is a block schematic diagram of a second embodiment.

Having described a first embodiment, a second embodiment will now be described with reference to FIG. 2. FIG. 2 sets forth a more detailed example of a PE/ROM circuit. The PE/ROM circuit is designated by the general reference character 200 and includes some of the same general constituents as the first embodiment 100. To that extent, like constituents will be referred to by the same reference character but with the first digit being a "2" instead of a "1."

Associated with each column (204-0 to 204-2) is a sense circuit 210-0 to 210-2, an output signal line 212-0 to 212-2, and sense lines 214-0 to 214-2. Each output signal line (212-0 to 212-2) is coupled to the detect circuits 206-xy of its respective column, and provides one of the output values (X2 to X0). Each sense line (214-0 to 214-2) is coupled to the passgate circuits 208-xy of its respective column.

Each sense circuit (210-0 to 210-2) is coupled to the output signal line (212-0 to 212-2) and sense line (214-0 to 214-2) of its respective column. A sense circuit (210-0 to 210-2) can disable or enable the passgate circuits 208-xy of its corresponding column according to the potential of its output signal line (212-0 to 212-2). As but one example, if output signal line 212-2 is activated (low for example), passgate circuits 208-42, -52, -62 and -72 can be disabled. However, if output signal line 212-2 remains inactive (high for example), passgate circuits 208-42, -52, -62 and -72 can be enabled.

Input signals (M0–M7) can be received on input signal lines 216-xz, where x represents a particular row and z represents a segment number. The passgate circuits 208-xy can be conceptualized as dividing each signal line into a number of segments. Thus, the input signal line that receives input signal M0, is shown as 216-00, as it is not segmented. However, the input signal line that receives the M1 signal includes segments 216-10 and 216-11, resulting from the position of passgate circuit 208-10.

The detect circuits 206-xy of the second embodiment 200 can be coupled to an input signal line segment 216-xz, an output signal line (212-0 to 212-2), and a first potential VL. In one particular arrangement, each detect circuit 206-xy will drive its corresponding output signal line (212-0 to 212-2) to the VL potential when its input signal line segment 216-xy is at an active level.

In this way, the second embodiment 200 can include detect circuits 206-xy that drive an output signal line (212-0 to 212-2) associated with each column (204-0 to 204-2). A sense circuit (210-0 to 210-2) can then enable or disable the passgate circuits 208-xy of its column (204-0 to 204-2) by way of the corresponding sense line (214-0 to 214-2).

In the same general fashion as the first embodiment 100, the second embodiment 200 can be conceptualized as having output lines (212-2 to 212-0) of decreasing significance, as well as columns (204-2 to 204-0) of circuits (206-xy and 208-xy) of decreasing significance.

A detailed third embodiment will now be described with reference to FIG. 3. The third embodiment is a PE/ROM circuit that is designated by the general reference character 300. The third embodiment 300 includes some of the same general constituents as the second embodiment 200. To that extent, like constituents will be referred to by the same reference character but with the first digit being a "3" instead of a "2."

In the third embodiment 300, each detect circuit 306-xy is shown to include a detect transistor 318-xy. Each detect transistor 318-xy provides a controllable impedance path between its associated output signal line (312-0 to 312-2) and a low power supply voltage VSS. The impedance path of each detect transistor 318-xy is controlled according to the potential of its corresponding input signal line segment 316-xz. In the particular arrangement of FIG. 3, the detect transistors 318-xz are n-channel insulated gate field effect transistors, in particular, metal-oxide-semiconductor (NMOS) transistors. Each NMOS detect transistor has a gate coupled to an input signal line segment 316-xz and a source-drain path coupled between an output signal line (312-0 to 312-2) and a low power supply voltage (VSS).

In the third embodiment 300, the sense circuits (310-0 to 310-2) each provide a pair of complementary sense lines to the passgate circuits 308-xy of its respective column (304-0 to 304-2). The complementary sense lines include non-inverted sense lines 314-00 to 314-20 (SA0 to SA2) and inverted sense lines 314-01 to 314-21 (BSA0 to BSA2).

Each passgate circuit 308-xy includes a passgate transistor 320-xy and a disable transistor 322-xy. Each passgate transistor 320-xy provides a controllable impedance path between adjacent input signal line segments 316-xz. The impedance path of each passgate transistor 320-xy is controlled according to the potential of the corresponding non-inverted sense line (314-00 to 314-20). Each disable transistor 322-xy provides a controllable impedance path between its corresponding input signal line segment 316-xz and the low power supply voltage (VSS). The impedance path of each disable transistor 322-xy is controlled according to the potential of the corresponding inverted sense line (314-01 to 314-21).

Each passgate transistor 320-xy can enable an active input signal (M0 to M7) to propagate across input signal line segments 316-xz. Each disable transistor 322-xy can force an input signal line segment 316-xz to a disable potential. When a disable transistor 322-xy forces an input signal line segment 316-xz to a disable potential, it can prevent a detect circuit 306-xy connected to the input signal line segment 316-xz from driving its output signal line low.

Figure 3:
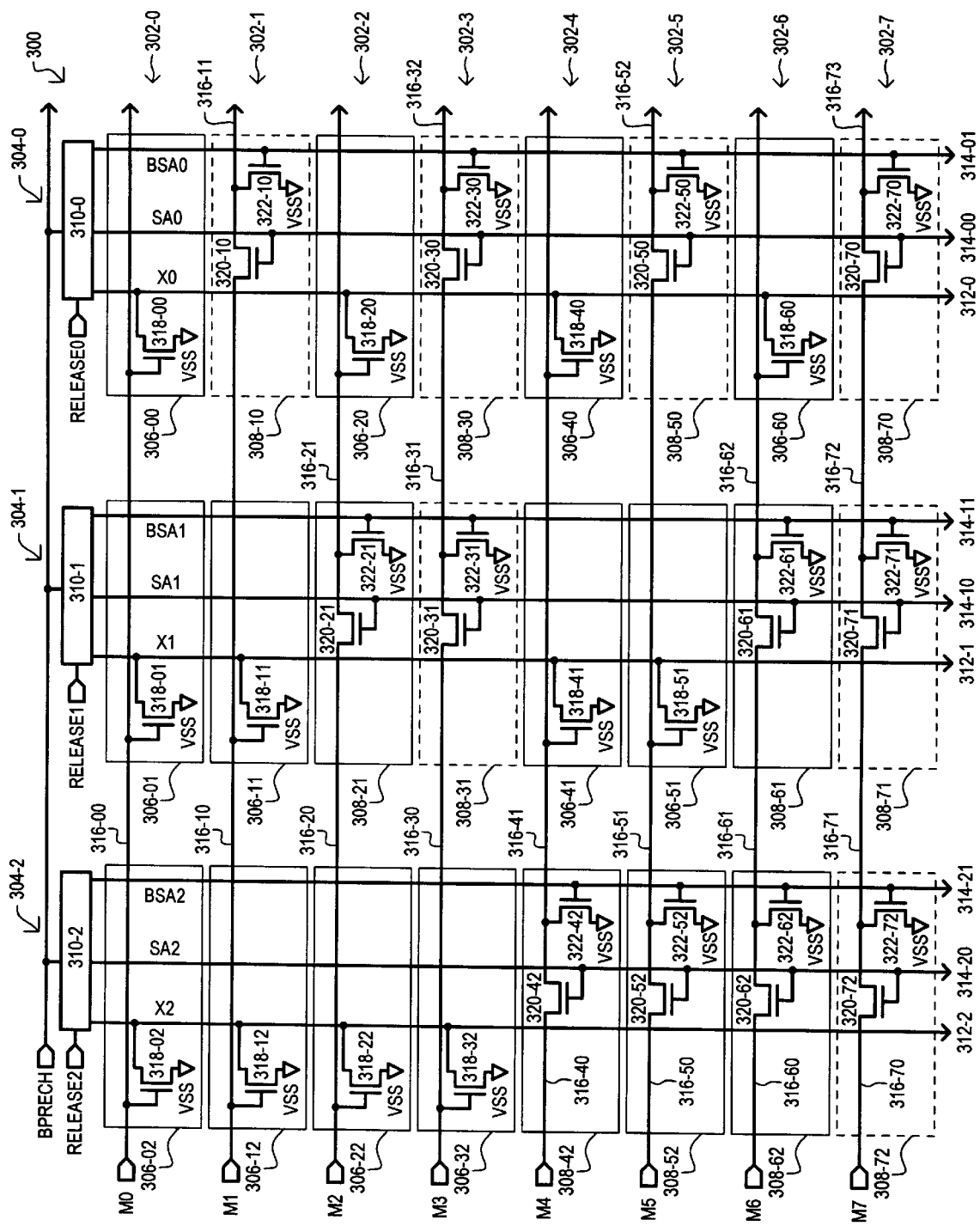
FIG. 3 is a schematic diagram of a third embodiment.

In the particular arrangement of FIG. 3, the passgate transistors 320-xy and disable transistors 322-xz are n-channel insulated gate field effect transistors, in particular, NMOS transistors. Each NMOS passgate transistor has a gate coupled to a non-inverted sense line (314-00 to 314-20) and a source-drain path connected between adjacent input signal line segment 316-xz. Each NMOS disable transistor has a gate coupled to an inverted sense line (314-01 to 314-21) and a source-drain path connected between an input signal line segment 316-xz and the low power supply voltage (VSS).

In the same general fashion as the first and second embodiments (100 and 200), the third embodiment 300 can be conceptualized as having output and sense lines (312-2 to 312-0, 314-21 to 314-00) of decreasing significance, as well as columns (304-2 to 304-0) of circuits (306-xy and 308-xy) of decreasing significance.

Figure 4:
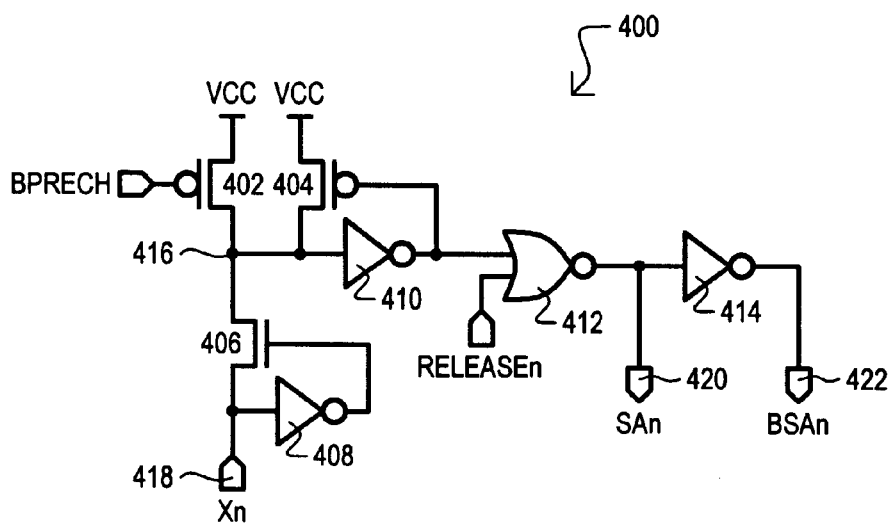
FIG. 4 is a schematic diagram of a sense circuit according to one embodiment.

Referring now to FIG. 4, one example of a sense circuit is set forth in schematic diagram. The sense circuit is designated by the general reference character 400, and is shown to include a precharge transistor 402, a keeper transistor 404, and a sense transistor 406. Also included are a first sense inverter 408, a second sense inverter 410, a NOR gate 412, and output inverter 414. In the particular arrangement of FIG. 4, precharge and keeper transistors (402 and 404) are p-channel MOS (PMOS) transistors while sense transistor 406 is an NMOS transistor.

Precharge and keeper transistors (402 and 404) have source-drain paths connected between a high power supply voltage VCC and a sense node 416. The gate of precharge transistor 402 receives a precharge signal BPRECH. The gate of keeper transistor 404 is connected to the output of second sense inverter 410. The source-drain path of sense transistor 406 is connected between an input node 418 and the sense node 416. The gate of sense transistor 406 is connected to input node 418 by way of first sense inverter 408.

NOR gate 412 is a two-input NOR gate having one input connected to the output of second sense inverter 410 and another input that receives a release signal RELEASEn. The output of NOR gate 412 is a non-inverted sense signal SAn. The non-inverted sense signal SAn is inverted by output inverter 414 to generate inverted sense signal BSAn.

The input node 418 may be connected to an output signal line (such as 212-0 to 212-2 or 312-0 to 312-2) and can receive an output value Xn. The sense signal SAn is provided on non-inverted sense node 420 which can be coupled to a non-inverted sense line (such as 314-00 to 314-20). The sense signal BSAn is provided on inverted sense node 422, which can be coupled to an inverted sense line (such as 314-01 to 314-21).

Figure 5:
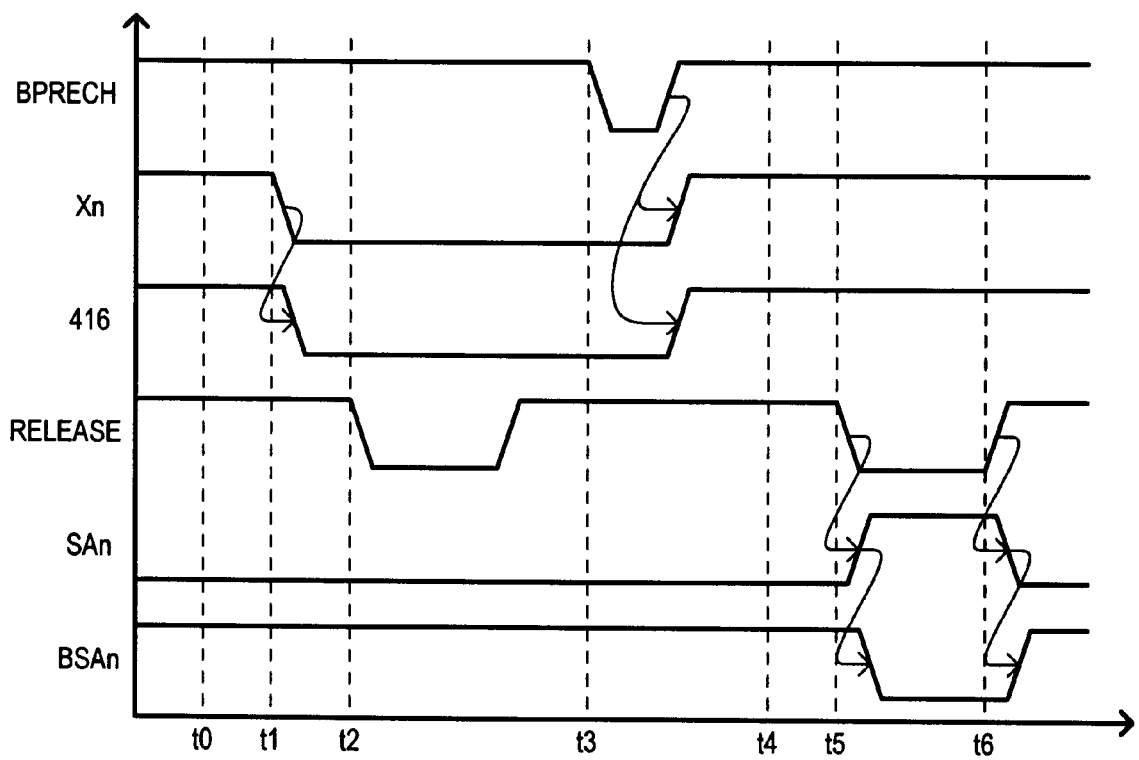
FIG. 5 is a timing diagram illustrating the operation of the sense circuit of FIG. 4.

The operation of the sense circuit 400 will now be described with reference to FIG. 5. FIG. 5 is a timing diagram that illustrates the response of BPRECH signal, input value Xn, the sense node (shown as "416"), the RELEASEn signal, the SAn signal, and the BSAn signal.

At time t0, the sense circuit 400 is in a precharged state. The BPRECH signal is inactive (high) and the value Xn and sense node 416 are high. The input signal may be precharged to a level less than Vcc−Vtn (where Vtn is the threshold voltage of the sense transistor 406) by a circuit such as a sense amplifier. The trip-point of inverter 408 can be set to be below this precharge level by appropriately sized transistors within inverter 408. The RELEASEn signal is also kept at a high level. With RELEASEn high, the SAn signal is forced low and the BSAn signal is forced high.

At time t1, the value Xn transitions low. This may be caused by a detect circuit (such 106-*xy* and/or 206-*xy* and/or 306-*xy*) being activated by an input signal (such as M0 to M7). A low Xn value results in first sense inverter 408 turning the sense transistor 406 on. This provides a low impedance path between sense node 416 and the low value Xn. Consequently, the sense node 416 is also driven low. With sense node 416 low, the output of second sense inverter 410 is driven high, turning off keeper transistor 404.

At time t2, the RELEASEn signal transitions low. However, because the output of second sense inverter 410 is already high, the SAn and BSAn signals do not change. If the SAn and BSAn signals do not change, passgate transistors coupled to the SAn signal can remain turned off while disable transistors coupled to the BSAn signal can remain turned on.

At time t3, the BPRECH signal temporarily transitions low, initiating a precharge operation in the sense circuit 400. At this time it is assumed that the input node 418 can be precharged by other precharge circuits or by precharge transistor 402. Consequently, sense node 416 and input node 418 return to a high level.

It is noted that at time t4, the Xn value does not transition low. As a result, the sense node 416 remains high and the output of second sense inverter 410 remains low.

At time t5, the RELEASEn signal transitions low. Because the output of inverter 410 is low, NOR gate 412 drives the SAn signal high. The BSA signal is then driven low. If reference is made to FIG. 4, a high SAn signal and low BSA signal can enable a passgate circuit (such as 308-*xy*), allowing an input signal (M0–M7) to propagate further into the PE/ROM circuit 300.

At time t6, the RELEASEn signal returns high resulting in the SAn signal being driven low and the BSAn signal being driven high. These signal levels can disable those passgate circuits that were previously enabled.

Figure 6:
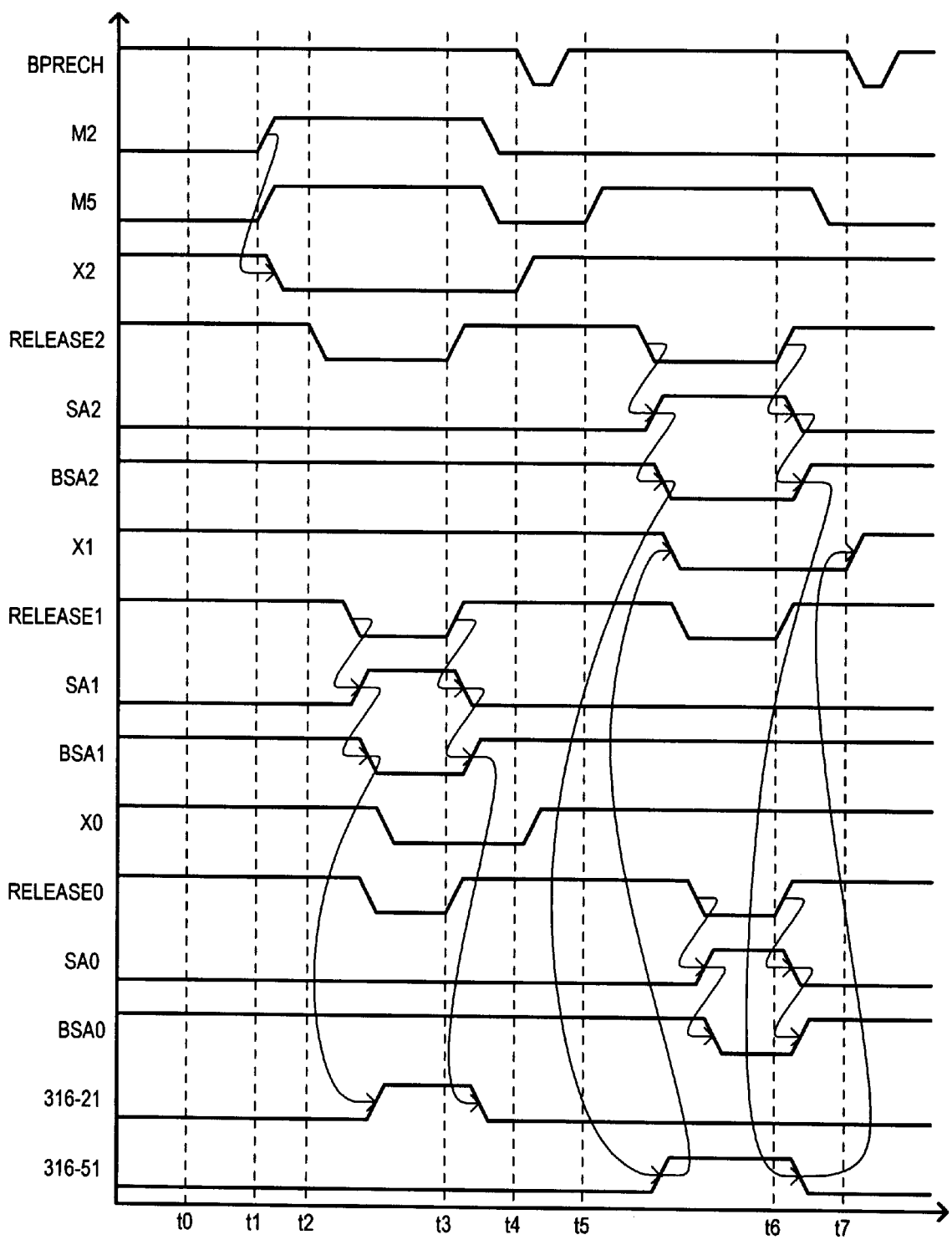
FIG. 6 is a timing diagram illustrating the operation of the third embodiment.
Figure 7:
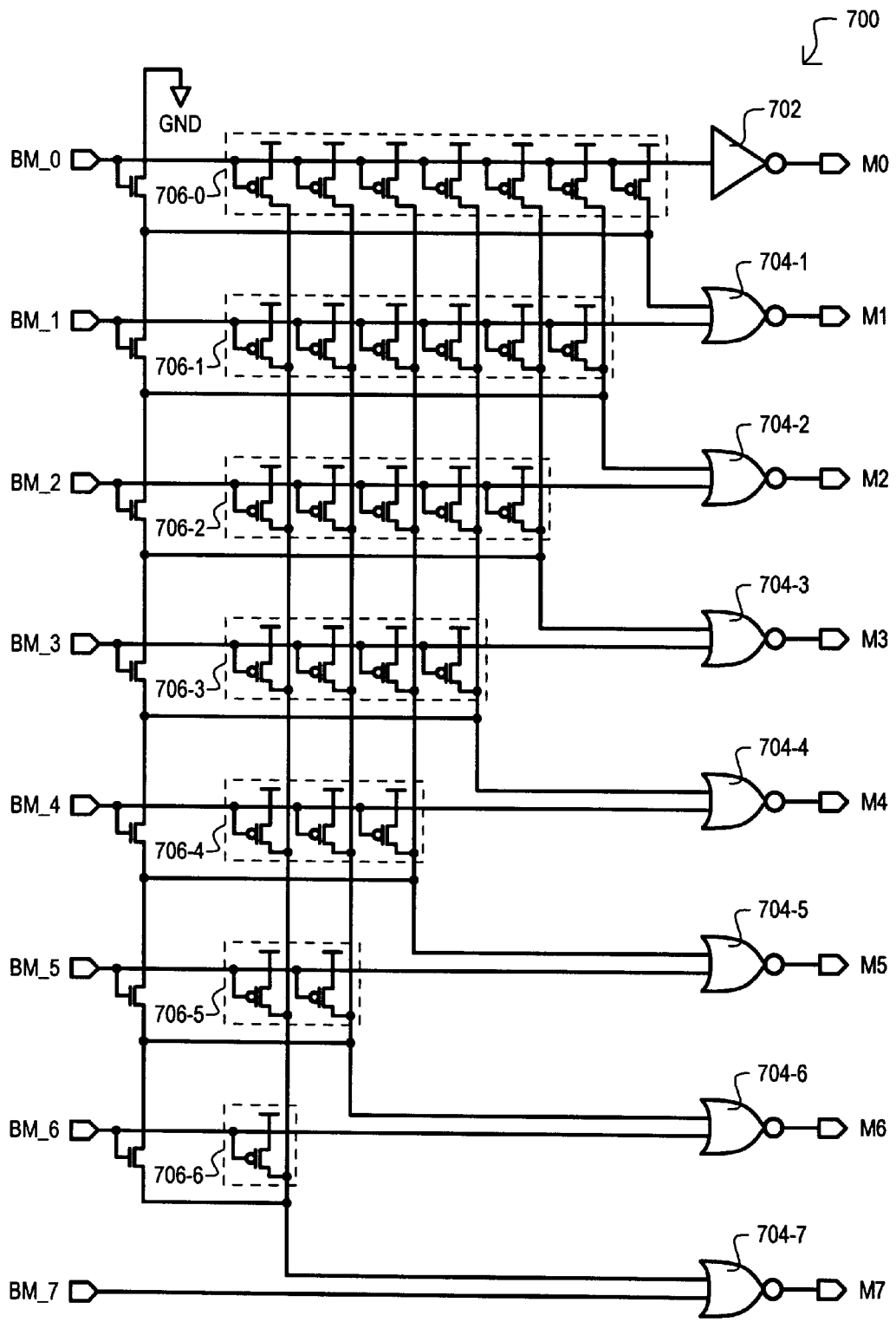
FIG. 7 is a schematic diagram of a conventional priority encoder.
Figure 8:
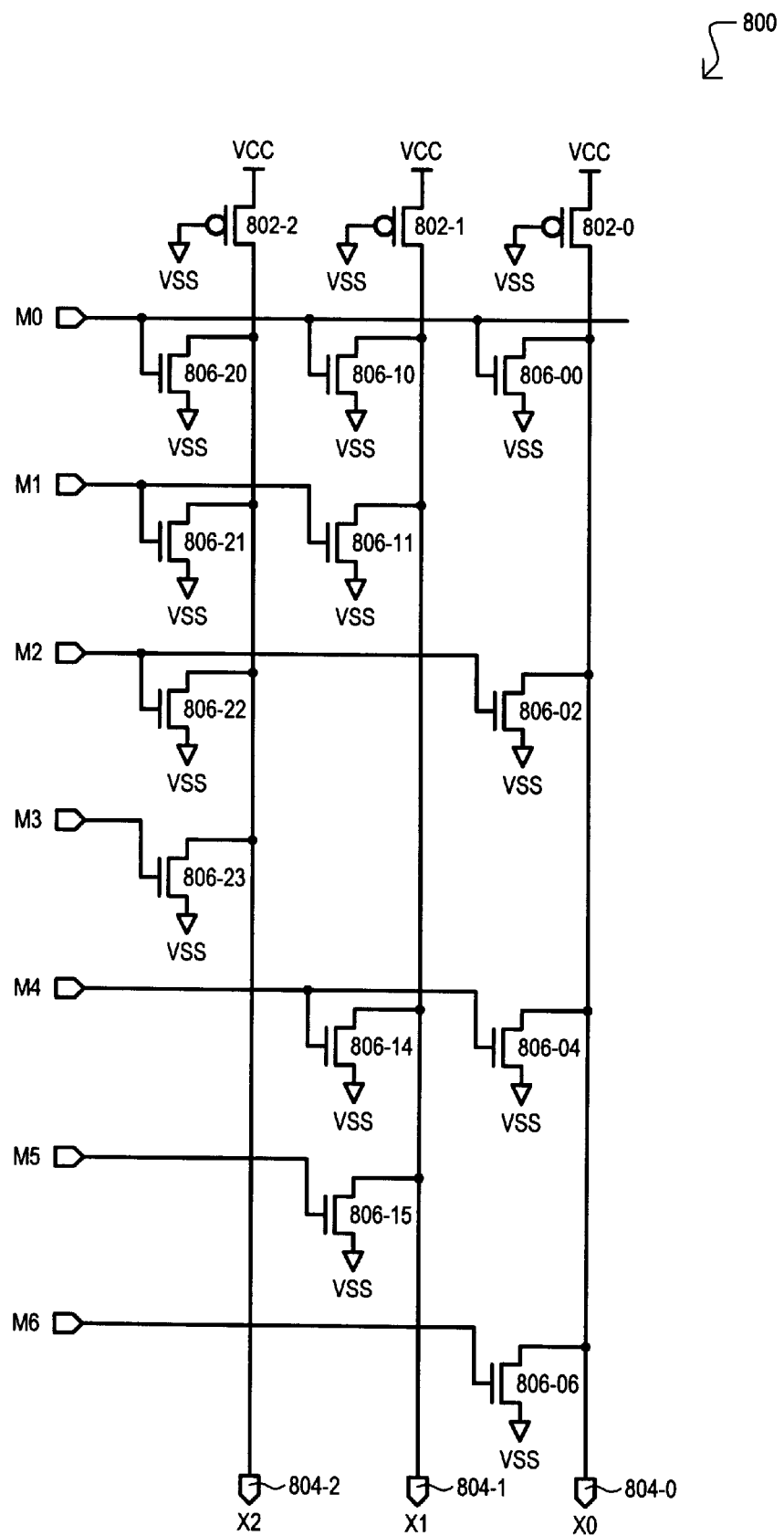
FIG. 8 is a schematic diagram of a conventional address encoder circuit in the form of a read only memory (ROM).

The operation of the third embodiment 300 will now be described with another timing diagram set forth in FIG. 6. FIG. 6 illustrates two priority/encoder operations by the third embodiment 300. A first operation illustrates the activation of two input signals M2 and M5. A second operation illustrates the activation of a single input signal M5.

FIG. 6 includes the response of BPRECH signal, input signals M2 and M5, output values X2 to X0, non-inverted sense signals SA2 to SA0, inverted sense signals BSA2 to BSA0, release signals RELEASE2 to RELEASE0, and two particular input signal line segments 316-21 and 316-51 (shown as "316-21" and "316-51," respectively).

Referring now to FIG. 6, at time t0, the PE/ROM circuit 300 is in a precharged state. In the precharged state, the input signals M2 and M5 are inactive (low) and passgate circuits 308-*xy* are disabled. Consequently, input signal line segments 316-*xz* are isolated from one another and forced to a disable potential (VSS, in this case). In particular, all release signals (RELEASE2 to RELEASE0) are high, resulting in low non-inverted sense signals (SA0 to SA2) and high inverted sense signals. The low non-inverted sense signals (SA0 to SA2) turn off passgate transistors 320-*xy* and turn on disable transistors 322-*xy*.

At time t1, the two illustrated input signals M2 and M5 are activated (go high). The PE/ROM circuit 300 must prioritize between the two (selecting signal M2, in this example), and then encode the selected signal into an output value (X2 to X0). In the arrangement of FIG. 3 this can be accomplished by an active higher priority input signal (M2) preventing a lower priority input signal (M5) from propagating through the circuit.

In particular, with the M2 signal high, detect transistor 318-22 turns on, driving the X2 value low. Because the RELEASE2 signal is high, the SA2 signal remains low and the BSA2 signal remains high.

At time t2, the RELEASE2 signal transitions low. However, because the X2 value is low, the SA2 signal continues to be low and the BSA2 continues to be high. These values keep passgate circuits 308-42, -52, -62 and -72 disabled, preventing the high M5 signal from propagating to segment 316-51.

In contrast, after time t2, the RELEASE1 signal transitions low. Because the X1 signal was previously precharged high, and not discharged by the M2 or M5 input signals, when the RELEASE1 signal transitions low, the SA1 signal goes high and the BSA1 signal goes low. This enables passgate circuit 308-21, allowing the high M2 signal to propagate from input signal line segment 316-20 to 316-21. When input signal line segment 316-21 is high, detect transistor 318-20 is turned on, driving the X0 value low.

The RELEASE0 signal then transitions low. However, because the X0 value is low, non-inverted sense signal SA0 remains low and inverted sense signal BSA0 remains high.

It is noted that in the arrangement of FIG. 3, the various release signals (RELEASE2 to RELEASE0) transition low sequentially in time. The time difference between release signals (RELEASE2 to RELEASE0) is sufficient to allow each column (304-0 to 304-2) to evaluate the potential of its respective input signal line segments 316-*xz*.

At time t3, the release signals (RELEASE2 to RELEASE0) return high. When the RELEASE1 signal returns high, the SA1 signal returns low and the BSA1 signal returns high. With the SA1 signal low, passgate transistor 320-21 will be turned off, isolating input signal line segment 316-20 from input signal line 316-21. With the BSA1 signal high, disable transistor 318-21 will be turned on, discharging input signal line segment 316-21.

After time t3, the input signals (M0 to M7) return low, allowing for a precharge operation and the subsequent activation of one or more input signals.

In this way, when the PE/ROM 300 receives multiple active input signals, higher priority input signals can prevent lower priority input signals from propagating further into the circuit 300, stopping such lower priority input signals from driving the output value (X0 to X2) to erroneous values.

At time t4, the BPRECH signal temporarily transitions low, placing the PE/ROM circuit 300 into the precharged state.

At time t5, the input signal M5 is activated (transitions high). It is assumed that the input signals M0 to M4 remain inactive (low). The RELEASE2 signal then transitions low. Because the X2 value remains in the precharged state (high), the low RELEASE2 signal results in the SA2 signal going high and the BSA2 signal going low. This signal arrangement results in passgate circuits 308-42, -52, -62, and -72 being enabled. Consequently, input signal line segment 316-51 transitions high. With segment 316-51 high, detect transistor 318-51 is turned on, which drives output value X1 low.

The RELEASE1 signal can then transition low. However, because the X1 value is low, the SA1 signal will remain low and the BSA1 signal will remain high.

The RELEASE0 signal can then transition low. Because the X0 value remains in the precharged state (high), the low RELEASE0 signal results in the SA0 signal going high and the BSA0 signal going low. This signal arrangements results in passgate circuits 308-10, -30, -50, and -70 being enabled. Consequently, input signal line segment 316-52 transitions high.

At time t6, the release signals (RELEASE2 to RELEASE0) return high, once again placing all the passgate circuits 308-*xy* in the disabled state. At time t7, the BPRECH signal temporarily transitions low, placing the PE/ROM circuit 300 into the precharged state.

In this way, the third embodiment 300 controls the propagation of an active input signal according to the highest priority input signal.

It is noted that the circuit portion shown in FIG. 3 includes a total of 36 transistors. This represents a considerable savings over the conventional approach previously described. Further, as shown in FIG. 3, particular detect circuits 306-*xy* and passgate circuits 308 are shown with dashed outlines. These circuits would not be necessary for an eight value encoding function as there is no need to control the propagation of an active input signals past the least significant column 304-0, or to columns that do not include "downstream" detect circuits. Thus, the circuit 300 of FIG. 3 could actually be implemented with 22 transistors.

One skilled in the art would recognize that while the various embodiments have described particular examples where eight input values are encoded into a 3-bit binary value, the teachings set forth herein can be used to prioritize and encode larger numbers of input signals. As but one limited example, n input signals can be encoded into $\log_2 n$ output value bits.

Various embodiments have been described that can prioritize multiple input signals, and then encode the signal having the highest priority into a binary value. Such a circuit could be used in place of approaches that utilize a priority encoder and address encoder (such as a ROM) combination.

Embodiments have been described that can provide lower transistor count in the main prioritizing/encoding circuit section than conventional approaches. This can allow for smaller integrated circuit (IC) sizes and/or free up more area for other circuit potions of an IC.

The various embodiments may be utilized in a variety of applications, but may have particular utility when employed in a content addressable memory (CAM). In a CAM, the various embodiments can receive match line values as input signals and the resulting encoded value can be used as associated data or an index to access stored associated data.

Finally, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A circuit, comprising:
   a plurality of output lines;
   a plurality of detect circuits, each detect circuit providing a controllable impedance path between an associated output line and a first potential;
   a plurality of input signal line segments arranged into rows; and
   a plurality of passgate circuits, each passgate circuit providing a controllable impedance path between adjacent input signal line segments of the same row; wherein
   the detect circuits and passgate circuits are arranged into columns, each column being associated with an output line, the passgate circuits of the column being disabled in response the associated output line having a first value, and enabled in response to the output line having a second value.

2. The circuit of claim 1, wherein:
   each detect circuit includes a sense field effect transistor having a source-drain path coupled between the output line and the first potential.

3. The circuit of claim 2, wherein:
   the gate of the sense field effect transistor is coupled to an input signal line segment.

4. The circuit of claim 1, further including:
   at least one sense line coupled to the passgate circuit of each column, each passgate circuit being disabled by a disable potential on the sense line and enabled by an enable potential on the sense line; and
   a sense circuit associated with each column, each sense circuit driving the at least one sense line of the columns to the disable potential in response the output line of the column having the first value and to the enable potential in response to the output line of the column having a second value.

5. The circuit of claim 4, wherein:
   each passgate circuit includes a passgate field effect transistor having a source-drain path coupled between the adjacent input signal line segments.

6. The circuit of claim 5, wherein:
   the gate of the passgate field effect transistor is coupled to at least one sense line.

7. The circuit of claim 4, wherein:
   each detect circuit is coupled to an input signal line segment and is disabled when the input signal line segment is at a disable potential; and
   each passgate circuit includes a disable field effect transistor having a source-drain path coupled between an adjacent input signal line segment and the disable potential.

8. A circuit that prioritizes a plurality of input signals and encodes the input signal having the highest priority, the circuit comprising:
   a plurality of input nodes;
   a more significant output line;
   a less significant output line;
   a plurality of more significant detect circuits coupled to the more significant output line, each more significant detect circuit driving the more significant output line to a first predetermined potential when at least one higher priority input node receives an active input signal;
   a plurality of less significant detect circuits coupled to the less significant output line, each less significant detect circuit driving the less significant output line to the first predetermiined potential when at least one lower priority input node receives an active input signal; and
   a plurality of more significant passgate circuits coupled to the more significant output line, each more significant passgate circuit coupling selected lower priority input nodes to an associated less significant detect circuits when the more significant output line is at the first predetermined potential.

9. The circuit of claim 8, wherein:
   each more significant detect circuit includes a transistor having a controllable impedance path disposed between the more significant output line and the first predetermined potential.

10. The circuit of claim 8, wherein:

each less significant detect circuit includes a transistor having a controllable impedance path disposed between the less significant output line and the first predetermined potential.

11. The circuit of claim 8, wherein:

the circuit includes N input nodes and $\log_2 N$ output lines.

12. The circuit of claim 8, wherein:

each more significant passgate circuit includes a transistor having a controllable impedance path disposed between an input node and a less significant detect circuit.

13. The circuit of claim 8, wherein:

each more significant passgate circuit isolates lower priority input nodes from the associated less significant detect circuits when the more significant output line is at a second predetermined potential.

14. The circuit of claim 13, wherein:

each more significant passgate circuit disables the associated less significant detect circuit when the more significant output line is at the second predetermined potential.

15. A method for prioritizing and encoding a plurality of input signals, the method comprising the steps of:

providing a number of output lines including a most significant output line and a plurality of lower significance output lines;

when at least one selected higher priority input signal is active, driving a most significant output line to a first value with a most significant detect circuit and preventing lower priority input signals from propagating to less significant detect circuits coupled to less significant output lines; and when at least one selected lower priority input signal is active and higher priority signals are inactive, allowing the at least one lower priority signal to propagate to less significant detect circuits and drive a less significant output line to the first value.

16. The method of claim 15, wherein:

preventing lower priority input signals from propagating to less significant detect circuits includes isolating less significant detect circuits from input nodes.

17. The method of claim 15, wherein:

preventing lower priority input signals from propagating to less significant detect circuits includes disabling less significant detect circuits.

18. The method of claim 15, wherein:

preventing lower priority input signals from propagating to less significant detect circuits includes disabling passgate circuits coupled to the most significant output line; and allowing the at least one lower priority signal to propagate to less significant detect circuits includes enabling passgate circuits coupled to the most significant output line.

19. The method of claim 18, further including:

providing a sense line corresponding to each output line;

each passgate circuit is associated with a particular sense line; and enabling and disabling passgate circuits according to potential of the associated sense line.

20. The method of claim 15, further including:

precharging the output lines to a second value prior to activating any of the input signals.

* * * * *